(12) United States Patent
Zhao et al.

(10) Patent No.: US 12,207,508 B2
(45) Date of Patent: Jan. 21, 2025

(54) DISPLAY PANEL AND DISPLAY DEVICE (71) Applicants: Chongqing BOE Display Technology Co., Ltd., Chongqing (CN); BOE Technology Group Co., Ltd., Beijing (CN)

(72) Inventors: Tianlong Zhao, Beijing (CN); Hyoungseok Park, Beijing (CN); Zifeng Wang, Beijing (CN); Dawei Shi, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 62 days.

(21) Appl. No.: 17/629,573

(22) PCT Filed: Mar. 9, 2021

(86) PCT No.: PCT/CN2021/079697
§ 371 (c)(1),
(2) Date: Jan. 24, 2022

(87) PCT Pub. No.: WO2021/218395
PCT Pub. Date: Nov. 4, 2021

(65) Prior Publication Data
US 2024/0049531 A1    Feb. 8, 2024

(30) Foreign Application Priority Data
Apr. 28, 2020 (CN) .......................... 202010348086.2

(51) Int. Cl.
*H10K 59/131* (2023.01)
*H10K 59/124* (2023.01)
*H10K 102/00* (2023.01)

(52) U.S. Cl.
CPC ......... *H10K 59/131* (2023.02); *H10K 59/124* (2023.02); *H10K 2102/311* (2023.02)

(58) Field of Classification Search
CPC .. H10K 59/131; H01L 27/124; H01L 27/1244
See application file for complete search history.

(56) References Cited

U.S. PATENT DOCUMENTS

2017/0194412 A1* 7/2017 Park .................... H10K 59/131
2021/0335986 A1* 10/2021 Jeon .................... H10K 59/131

FOREIGN PATENT DOCUMENTS

| CN | 109309101 A | 2/2019 |
| CN | 110970484 A | 4/2020 |
| CN | 111524908 A | 8/2020 |

* cited by examiner

*Primary Examiner* — Peter M Albrecht
(74) *Attorney, Agent, or Firm* — IPro, PLLC (57) ABSTRACT

Provided in the present disclosure are a display panel and a display device. The display panel comprises: a base substrate; multiple contact electrodes, arranged on the base substrate in a non-display region of the display panel; an inorganic film layer, arranged on the side of the contact electrodes in proximity to the base substrate; the inorganic film layer comprising an inorganic material; an organic film layer, arranged on the side of the contact electrodes away from the base substrate; and a barrier layer, arranged on the side of the organic film layer away from the base substrate; the barrier layer comprising an inorganic material; and, the organic film layer being provided with openings in at least some gaps between adjacent contact electrodes.

20 Claims, 5 Drawing Sheets

DISPLAY PANEL AND DISPLAY DEVICE

CROSS REFERENCE TO RELATED APPLICATIONS

This application is a national phase entry under 35 U.S.C. § 371 of International Application No. PCT/CN2021/079697, filed on Mar. 9, 2021, which claims priority of Chinese Patent Application No. 202010348086.2, filed with the China National Intellectual Property Administration (CNIPA) on Apr. 28, 2020 and entitled "Display Panel and Display Device", the entire content of which is incorporated herein by reference.

FIELD

The present disclosure relates to the technical field of display, in particular to a display panel and a display device.

BACKGROUND

An organic light-emitting diode (OLED) has the advantages of being self-luminous, fast in response, wide in viewing angle, high in brightness, bright in color, thin and light weight, etc., and is considered to be the next generation of display technology. Flexible multi-layer on cell (FM-LOC) may dispose a touch electrode layer inside an OLED display panel to realize a touch function and make the OLED display panel lighter and thinner, thereby gradually becoming a mainstream touch technology.

A binding region is disposed in a non-display region of the OLED display panel. There are a plurality of contact electrodes in the binding region, and the OLED display panel can be electrically connected with a control chip through the contact electrodes. However, the control chip is very prone to falling off in a high temperature and high humidity environment.

SUMMARY

A display panel provided by embodiments of the present disclosure, includes:
 a base substrate;
 a plurality of contact electrodes, on the base substrate in a non-display region of the display panel;
 an inorganic film layer, on sides, close to the base substrate, of the contact electrodes; the inorganic film layer including an inorganic material;
 an organic film layer, on sides, facing away from the base substrate, of the contact electrodes; and
 a barrier layer, on a side, facing away from the base substrate, of the organic film layer; the barrier layer including an inorganic material.

The organic film layer is provided with openings in at least part of gaps between adjacent contact electrodes among the plurality of contact electrodes.

Optionally, in embodiments of the present disclosure, in the at least part of the gaps between the adjacent contact electrodes, the barrier layer is in contact with the inorganic film layer through the openings.

Optionally, in embodiments of the present disclosure, in a gap between any two adjacent contact electrodes, the barrier layer is in contact with the inorganic film layer through the openings.

Optionally, in embodiments of the present disclosure, the organic film layer includes: a plurality of first through holes each corresponding to a respective one of the plurality of contact electrodes.

The barrier layer includes: a plurality of second through holes each corresponding to a respective one of the plurality of first through holes.

The contact electrodes are exposed through the first through holes and second through holes.

Optionally, in embodiments of the present disclosure, the organic film layer is attached to side edges of the contact electrodes to protect the contact electrodes.

Optionally, in embodiments of the present disclosure, the organic film layer covers edges of surfaces of the sides, facing away from the base substrate, of the contact electrodes.

Optionally, in embodiments of the present disclosure, in the non-display region, an orthographic projection of the organic film layer on the base substrate is within an orthographic projection of the barrier layer on the base substrate.

Optionally, in embodiments of the present disclosure, each contact electrode includes at least: a first sub-electrode and a second sub-electrode that are stacked.

The second sub-electrode is on a side, facing away from the base substrate, of the first sub-electrode.

Optionally, in embodiments of the present disclosure, the display panel further includes: a thin film transistor in a display region.

The first sub-electrodes and a source of the thin film transistor are located in the same film layer.

Optionally, in embodiments of the present disclosure, the display panel further includes: a gate line coupled with a gate of the thin film transistor.

The contact electrodes are coupled with the gate line.

Optionally, in embodiments of the present disclosure, the display panel further includes: a plurality of light-emitting devices, an encapsulation layer, and a touch electrode layer in a display region of the display panel.

The light-emitting devices are on the base substrate. The encapsulation layer covers the plurality of light-emitting diodes. The barrier layer extends into the display region. The barrier layer is on a side, facing away from the base substrate, of the encapsulation layer. The touch electrode layer is on a side, facing away from the base substrate, of the barrier layer.

Optionally, in embodiments of the present disclosure, the barrier layer and an interlayer insulating layer include the same inorganic material.

Optionally, in embodiments of the present disclosure, the base substrate includes: at least one layer of flexible substrate.

Correspondingly, embodiments of the present disclosure further provide a display device, including: the above display panel.

Optionally, in embodiments of the present disclosure, the display device further includes: a control chip.

The control chip includes: a plurality of contact terminals.

The contact terminals are directly bound and connected to contact electrodes in the display panel.

Optionally, in embodiments of the present disclosure, the display device further includes: a flexible circuit board and a control chip.

The control chip is bound and connected to contact electrodes through the flexible circuit board.

DETAILED DESCRIPTION OF THE EMBODIMENTS

Figure 1:
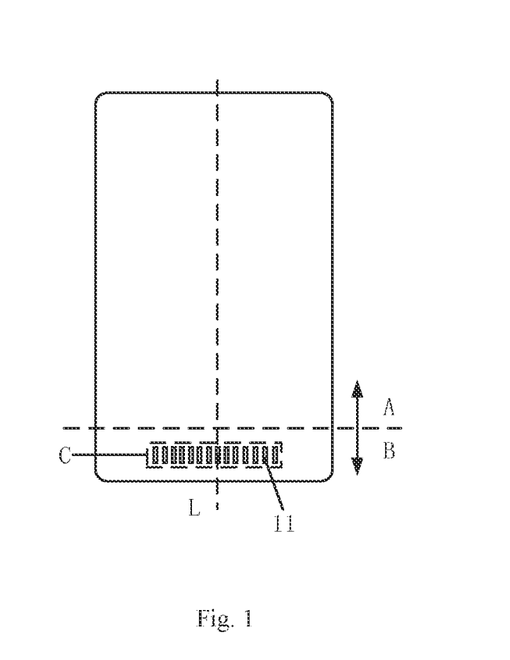
FIG. 1 is a schematic top view of a display panel provided by an embodiment of the present disclosure.

As shown in FIG. 1, an OLED display panel includes a display region A and a non-display region B. There is a binding region C in the non-display region B. There are a plurality of contact electrodes 11 in the binding region C. The OLED display panel may realize electric connection with a control chip through the contact electrodes 11. In gaps between adjacent contact electrodes 11, an organic film layer and a barrier layer covering the organic film layer are disposed.

Since the organic film layer includes an organic material, and the barrier layer includes an inorganic material, for example, the barrier layer may include a silicon nitride material, adhesion between the organic film layer and the barrier layer is poor. Moreover, the organic film layer has good water absorption, in a high temperature and high humidity environment, for example, the OLED display panel may be placed in a high temperature and high humidity environment in the reliability verification process, the organic film layer may absorb a lot of moisture, and air bubbles are generated between the organic film layer and the barrier layer, resulting in poor adhesion between the organic film layer and the barrier layer, so the barrier layer and the organic film layer are gradually separated, finally the barrier layer falls off, and even the control chip bound to the contact electrodes also falls off, which leads to breaking of a signal wire connected to the control chip, and poor display such as a bright line in the display region.

Based on this, embodiments of the present disclosure provide a display panel and a display device. The implementations of the display panel and the display device provided by embodiments of the present disclosure will be described in detail below with reference to drawings. The thickness and shape of each film layer in the drawings do not reflect the true scale, and are intended only to schematically illustrate the content of the present disclosure.

Figure 2:
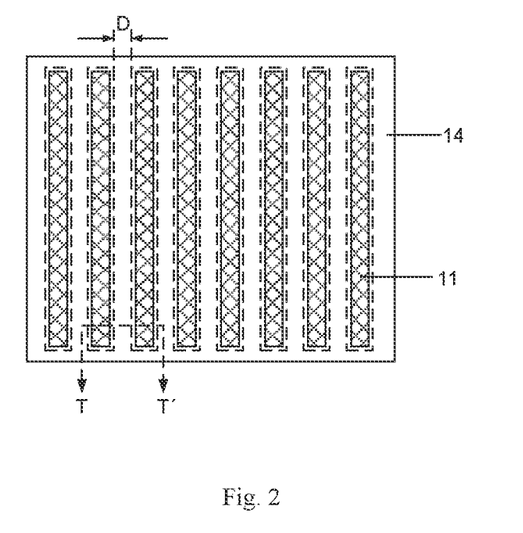
FIG. 2 is a schematic partial enlarged diagram of a binding region C in FIG. 1.
Figure 3:
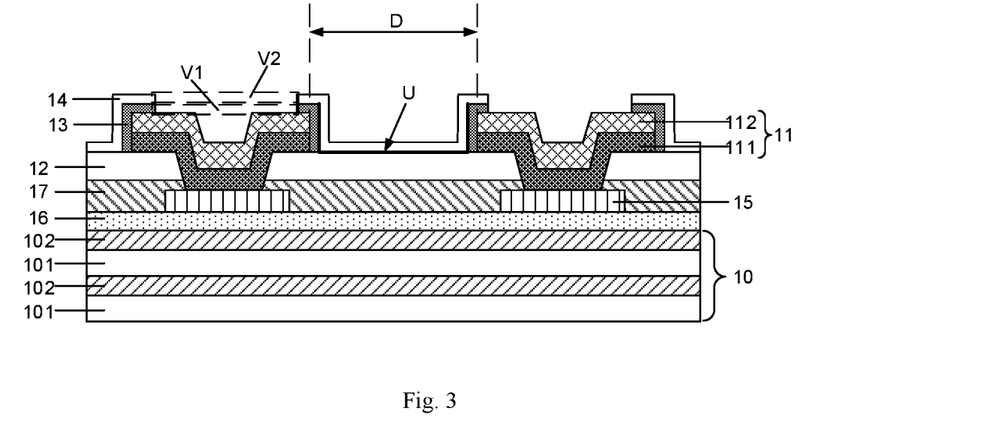
FIG. 3 is a schematic view of a cross-section along a dotted line TT' in FIG. 2.

FIG. 1 is a schematic top view of a display panel provided by an embodiment of the present disclosure, FIG. 2 is a schematic partial enlarged view of a binding region C in FIG. 1, and FIG. 3 is a schematic view of a cross-section along a dotted line TT' in FIG. 2. As shown in FIGS. 1 to 3, the display panel provided by embodiments of the present disclosure includes:

a base substrate 10;

a plurality of contact electrodes 11, on the base substrate 10 in a non-display region B of the display panel;

an inorganic film layer 12, on sides, close to the base substrate 10, of the contact electrodes 11; the inorganic film layer 12 including an inorganic material;

an organic film layer 13, on sides, facing away from the base substrate 10, of the contact electrodes 11; and a barrier layer 14, on a side, facing away from the base substrate 10, of the organic film layer 13; the barrier layer 14 including an inorganic material.

The organic film layer 13 is provided with openings U in at least part of gaps D between the adjacent contact electrodes 11.

In the display panel provided by embodiments of the present disclosure, by removing at least part of the organic film layer in the gaps between the adjacent contact electrodes, the organic film layer has the openings in the gaps between the adjacent contact electrodes, which reduces the water absorption of the organic film layer, prevents the barrier layer from falling off, and reduces the risk that the control chip falls off.

As shown in FIG. 1, the display panel includes a display region A and the non-display region B. The contact electrodes 11 may be located in a binding region C in the non-display region B. In FIG. 1, there are a limited quantity of contact electrodes 11, and the contact electrodes 11 are located in the same row for illustration. In practical application, the contact electrodes 11 in the binding region C are configured to be bound and connected to a control chip. Therefore, the quantity and arrangement manner of the contact electrodes 11 in the binding region C may be set according to the quantity and distribution of contact terminals of the control chip to be bound, which are not limited here.

Figure 4:
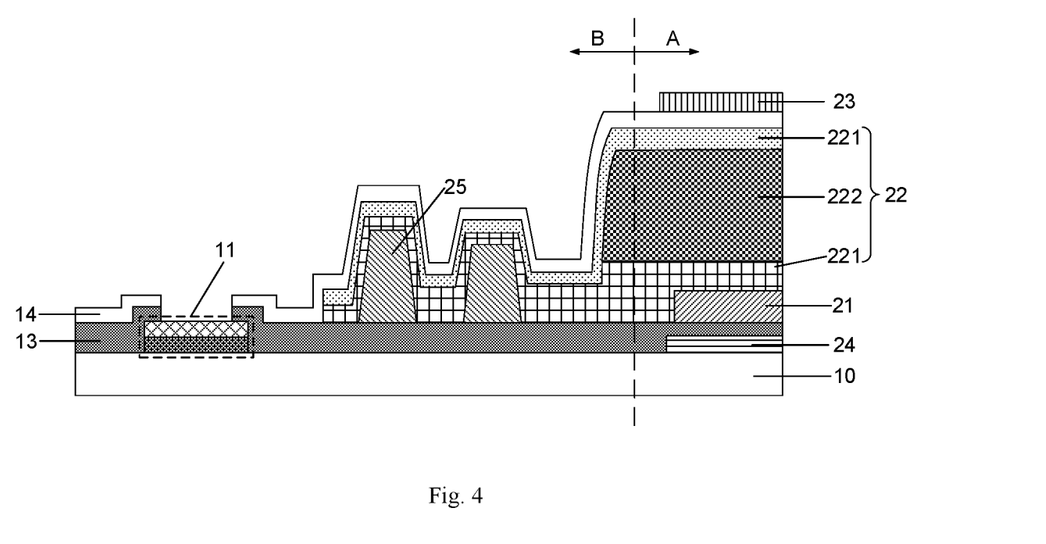
FIG. 4 is a schematic view of a cross-section along a dotted line L in FIG. 1.

FIG. 4 is a schematic view of a cross-section along a dotted line L in FIG. 1. As shown in FIG. 4, in embodiments of the present disclosure, the above display panel may be an organic electroluminescence display panel. In some embodiments, there are a plurality of light-emitting devices 21 in the display region A of the display panel. The light-emitting devices 21 may be organic electroluminescent diodes. In order to drive the light-emitting devices to emit light, a driving circuit 24 is disposed between the base substrate and the light-emitting devices. The driving circuit 24 may include a plurality of thin film transistors and a plurality of signal wires. The above organic film layer 13 may extend to the display region A and cover the driving circuit 24 in the display region A to function as a planarization layer, thereby providing a planarization substrate for the light-emitting devices 21. The above inorganic film layer 12 may extend to the display region A, and may isolate a source of a thin film transistor from an active layer to function as an interlayer insulating layer.

Since the organic film layer 13 generally includes an organic material, and the organic film layer 13 has water absorption, disposing the barrier layer 14 on the side, facing away from the base substrate 10, of the organic film layer 13 may protect the organic film layer 13, and play roles in waterproofing and improving mechanical properties.

It should be noted that the size of the contact electrodes 11 in the binding region C is small. In order to illustrate the structure of the contact electrodes 11 more clearly in the drawings of the embodiments of the present disclosure, the gaps D between the adjacent contact electrodes 11 are illustrated to be narrow. But in practical application, the size of the contact electrodes 11 should be smaller than the size of the gaps D. Thus, in the embodiments of the present disclosure, removing at least part of the organic film layer 13 in the gaps can significantly reduce the water absorption of the organic film layer, and can greatly improve the adhesion of the barrier layer, thereby preventing the barrier layer from falling off, and reducing the risk that the control chip falls off.

In some implementations, in a gap between adjacent contact electrodes, a large opening may be disposed in a planarization layer, or, according to actual requirements, a plurality of openings may be disposed in a planarization layer in the same one gap. The quantity of openings in the planarization layer of the same one gap is not limited here.

Further, in the above display panel provided by embodiments of the present disclosure, as shown in FIG. 3, in at least part of the gaps D between the adjacent contact electrodes 11, the barrier layer 14 is in contact with the inorganic film layer 12 through the openings U.

By removing at least part of the organic film layer 13 in the gaps D between the adjacent contact electrodes 11, the organic film layer 13 has the openings U in the gaps D between the adjacent contact electrodes 11, so that the barrier layer 14 is in contact with the inorganic film layer 12 through the openings U. Since the barrier layer 14 and the inorganic film layer 12 both include inorganic materials, adhesion between the barrier layer 14 and the inorganic film layer 12 is good, thereby increasing the adhesion of the barrier layer 14 and reducing the risk that the control chip falls off.

In the above display panel provided by embodiments of the present disclosure, referring to FIG. 3, the barrier layer 14 and the inorganic film layer 12 include the same inorganic material, so that the adhesion between the barrier layer 14 and the inorganic film layer 12 is better, thereby further enhancing the adhesion of the barrier layer 14. In some embodiments, the above inorganic film layer 12 may include a first inorganic layer and a second inorganic layer. The first inorganic layer may be made of a silicon oxide material. The second inorganic layer is on a side, facing away from the base substrate, of the first inorganic layer, and the second inorganic layer may be made of a silicon nitride material. The above barrier layer may also be made of a silicon nitride material, the barrier layer is in contact with the second inorganic layer, and adhesion between the barrier layer and the second inorganic layer is good.

In addition, in another implementation manner, in at least part of the gaps between the adjacent contact electrodes, the barrier layer may also be attached to the inorganic film layer through an adhesive layer, which can also make the barrier layer have strong adhesion and prevent the barrier layer from falling off.

Furthermore, in the above display panel provided by embodiments of the present disclosure, referring also to FIGS. 1 to 3, in a gap D between any two adjacent contact electrodes 11, the barrier layer 14 is in contact with the inorganic film layer 12 through the opening U.

That is to say, in the gap D between any two adjacent contact electrodes 11, part of the organic film layer 13 is removed so that the barrier layer 14 may be in contact with the inorganic film layer 12, and therefore the water absorption of the organic film layer can be further reduced, and the adhesion of the barrier layer can be further improved.

In some implementations, in order to further improve the adhesion of the barrier layer, in addition to removing the organic film layer in the gaps between the adjacent contact electrodes, the organic film layer at other positions in the binding region may also be removed, for example, the organic film layer at edges of the binding region may be removed.

In the above display panel provided by embodiments of the present disclosure, as shown in FIG. 1, the organic film layer 13 includes: a plurality of first through holes V1 each corresponding to a respective one of the plurality of contact electrodes 11.

The barrier layer 14 includes: a plurality of second through holes V2 each corresponding to a respective one of the plurality of first through holes V1.

The contact electrodes 11 are exposed through the corresponding first through holes V1 and second through holes V2.

By disposing the first through holes V1 in the organic film layer 13, and the second through holes V2 in the barrier layer 14, the contact electrodes 11 may be exposed through the corresponding first through holes V1 and second through holes V2 so that subsequent coupling with the control chip may be realized through the contact electrodes 11.

In some implementations, in the above display panel provided by embodiments of the present disclosure, as shown in FIG. 3, each contact electrode 11 includes at least: a first sub-electrode 111 and a second sub-electrode 112 that are stacked.

The second sub-electrodes 112 are located on sides, facing away from the base substrate 10, of the first sub-electrodes 111.

The above contact electrode 11 include at least the first sub-electrode 111 and the second sub-electrode 112 that are stacked, and the contact electrode 11 with a corresponding thickness may be obtained. In some implementations, the quantity of layers of sub-electrodes may be set according to the actually required thickness of the contact electrode 11. The above contact electrode 11 may also include more sub-electrodes that are stacked, or the contact electrode 11 may also include only one sub-electrode, and the quantity of sub-electrodes is not limited here.

Further, in the above display panel provided by embodiments of the present disclosure, as shown in FIG. 3, the above organic film layer 13 is attached to side edges of the contact electrodes 11 to protect the contact electrodes 11 so that the side edges of the contact electrodes 11 can be prevented from being corroded.

In some embodiments, the sub-electrodes in the above contact electrode 11 may include three stacked metallic film layers, and the metallic film layer located in the middle includes metallic aluminum. For example, the first sub-electrode 111 and/or the second sub-electrodes 112 includes three stacked metallic film layers, and the metallic film layer located in the middle includes metallic aluminum.

In the actual process, after the organic film layer 13 is formed, an anode film layer (the anode film layer is in the display region, and not shown in the figure) needs to be formed on the organic film layer 13, and then wet etching is performed on the anode film layer to obtain a plurality of anode patterns. Since the anode film layer contains metallic silver, by soaking the anode film layer in an etching solution in the wet etching process of the anode film layer, silver ions in the anode film layer may dissolve into the etching solution. Because the metallic film layer located in the middle of the first sub-electrode 111 and the second sub-electrode 112 generally includes the metallic aluminum, if the side edges of the contact electrodes 11 are exposed, the silver ions in the etching solution may undergo a substitution reaction with the metallic aluminum on the side edges of the contact electrodes 11, and metallic silver will be precipitated. The precipitated metallic silver will drift to various positions of the display panel through the etching solution, and ultimately the display property of the display panel is influenced.

In embodiments of the present disclosure, by attaching the organic film layer 13 to the side edges of the contact electrodes 11, in the wet etching process of the anode film layer, the side edges of the contact electrodes 11 are no longer exposed, thereby avoiding precipitation of the metallic silver, and ensuring that the display panel has a good display property.

Furthermore, in the above display panel provided by embodiments of the present disclosure, referring to FIG. 3, the organic film layer 13 covers edges of surfaces of the sides, facing away from the base substrate 10, of the contact electrodes 11, so that the side edges of the contact electrodes 11 may be completely wrapped, ensuring that no metallic silver precipitates in the wet etching process of the anode film layer.

Figure 5:
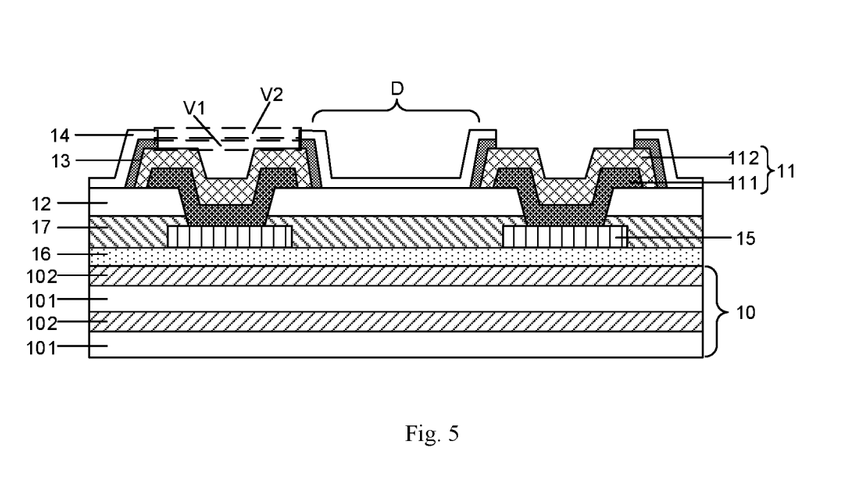
FIG. 5 is another schematic view of a cross-section along a dotted line TT' in FIG. 2.

FIG. 5 is another schematic view of the cross-section along the dotted line TT' in FIG. 2. As shown in FIG. 5, in the above contact electrodes 11, edges of the second sub-electrodes 112 may be set to be attached to side edges of the first sub-electrodes 111, so that in the wet etching process of the anode film layer, the metallic aluminum of the side edges of the first sub-electrodes 111 is no longer exposed, and the silver ions in the etching solution may be further prevented from making contact with the metallic aluminum in the contact electrodes 11, which further reduces the risk of metallic silver precipitation.

Figure 6:
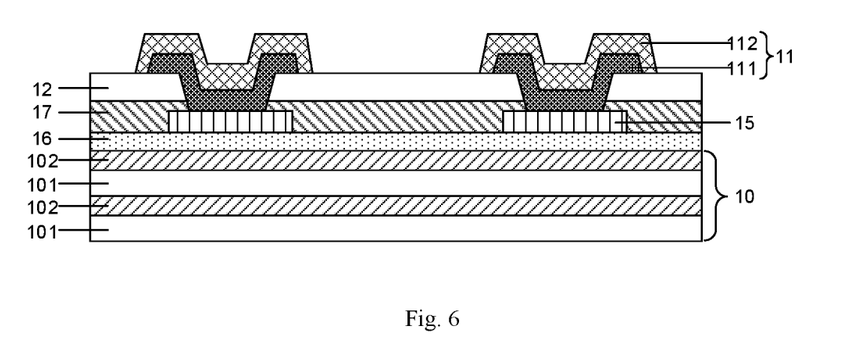
FIG. 6 is a schematic structural diagram after contact electrodes are formed.
Figure 7:
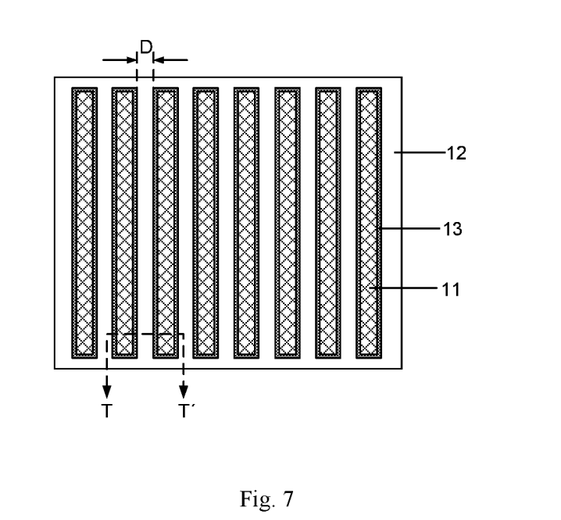
FIG. 7 is a schematic top view after an organic film layer is formed.
Figure 8:
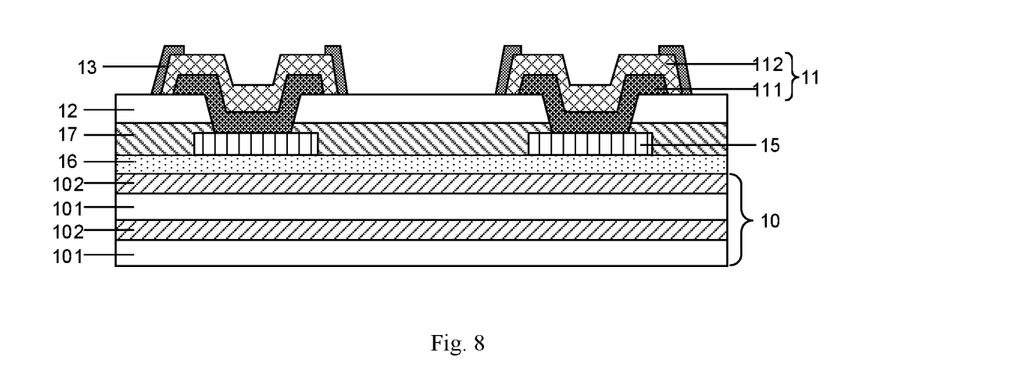
FIG. 8 is a schematic view of a cross-section along a dotted line TT' in FIG. 7.

Taking the structure shown in FIG. 5 as an example, FIG. 6 is a schematic structural diagram after each contact electrode 11 is formed, FIG. 7 is a schematic top view after the organic film layer 13 is formed, and FIG. 8 is a schematic view of a cross-section along a dotted line TT' in FIG. 7. As shown in FIGS. 6 to 8, in practical application, in order to improve the adhesion of the barrier layer 14 to a greater extent, in addition to reserving part of the organic film layer 13 covering the side edges of the contact electrodes 11, the remaining organic film layer 13 in the gaps D between the adjacent contact electrodes 11 may be totally removed.

In some implementations, in the above display panel provided by embodiments of the present disclosure, as shown in FIG. 3, in the non-display region, an orthographic projection of the organic film layer 13 on the base substrate 10 is within an orthographic projection of the barrier layer 14 on the base substrate 10, that is, in the non-display region, the organic film layer 13 is completely wrapped by the barrier layer 14, thereby preventing the organic film layer 13 from absorbing water.

Optionally, the above display panel provided by embodiments of the present disclosure, referring to FIGS. 3 and 4, may further include: a thin film transistor in the display region A. As shown in FIG. 4, the thin film transistor may be in the driving circuit 24.

The first sub-electrodes 111 and a source of the thin film transistor are located in the same film layer.

In the actual process, the first sub-electrodes and the source of the thin film transistor may be manufactured in the same patterning process. For example, a metallic film layer may be formed, and the metallic film layer may be patterned by using the same mask to obtain patterns of the first sub-electrodes and the source of the thin film transistor, so that the manufacturing process may be simplified and the manufacturing cost may be reduced.

In some implementations, the above display panel provided by embodiments of the present disclosure, referring to FIG. 3, may further include: a gate line 15 coupled with a gate of the thin film transistor.

The contact electrodes 11 are coupled with the gate line 15.

In embodiments of the present disclosure, the thin film transistor is generally in the display region. One end of the gate line 15 is coupled with the gate of the thin film transistor, and the other end of the gate line 15 extends to the non-display region to be coupled with the contact electrodes 11. After the control chip is bound and connected to the contact electrodes 11, the control chip may be coupled with the gate of the thin film transistor. Therefore, the contact electrodes 11 may transmit a control signal sent by the control chip to the gate, so that whether the thin film transistor is connected or not may be controlled by the control chip, so as to control the light-emitting devices to emit light.

The above display panel provided by the embodiment of the present disclosure, referring to FIG. 4, may further include: a plurality of light-emitting devices 21, an encapsulation layer 22, and a touch electrode layer 23 in the display region A of the display panel.

The light-emitting devices 21 are on the base substrate 10. The encapsulation layer 22 covers the plurality of light-emitting diodes 21. The barrier layer 14 extends into the display region A, and the barrier layer 14 is located on a side, facing away from the base substrate 10, of the encapsulation layer 22. The touch electrode layer 23 is located on a side, facing away from the base substrate 10, of the barrier layer 14.

The above barrier layer 14 functions to isolate the touch electrode layer 23 from the encapsulation layer 22 in the display region A. The barrier layer 14 extends into the binding region of the non-display region B, and may also function to protect the organic film layer 13, prevent water and improve mechanical properties.

The above encapsulation layer may include inorganic layers 221 and an organic layer 222 that are stacked and alternately disposed. The inorganic layers 221 play a role of blocking water vapor and oxygen, and the organic layer 222 plays a role of releasing stress. The touch electrode layer 23 may include a plurality of self-capacitance electrodes that are independent of one another, Or, the touch electrode layer 23 may also include a plurality of first touch electrodes and a plurality of second touch electrodes, and the first touch electrodes and the second touch electrodes are insulated.

As shown in FIG. 4, in order to prevent cracks generated in the cutting process from extending into the display region A, at least one blocking dam 25 surrounding the display region A may also be provided, and the inorganic layers 221 in the encapsulation layer 22 may cover the blocking dam 25, thereby increasing the area of the inorganic layers 221, extending a transmission path of water vapor and oxygen, and preventing transmission of water vapor and oxygen into the display region A.

In practical application, in the above display panel provided by embodiments of the present disclosure, as shown in FIG. 3, the above base substrate 10 may include: at least one layer of flexible substrate 101. In this way, the display panel may have a certain degree of flexibility, or realize a bendable property. In FIG. 3, the base substrate 10 includes two layers of flexible substrates 101 as an example for illustration. In implementations, the quantity of layers of flexible substrates 101 may be set according to actual needs, which is not limited here. A buffer layer 102 may further be disposed on a side, close to the contact electrodes 11, of each flexible substrate 101.

As shown in FIG. 3, the above display panel may further include: a first gate insulating layer 16 located between the base substrate 10 and the gate line 15, and a second gate insulating layer 17 located between the first gate insulating layer 16 and the inorganic film layer 12.

Based on the same inventive concept, embodiments of the present disclosure further provide a display device, including the above display panel. The display device may be applied to any product or component with a display function such as mobile phones, tablet computers, televisions, displays, notebook computers, digital photo frames and navigators. Since the principle of solving the problems of the display device is similar to that of the above display panel, the implementations of the display device may refer to the implementations of the above display panel, which will not be repeated.

Figure 9:
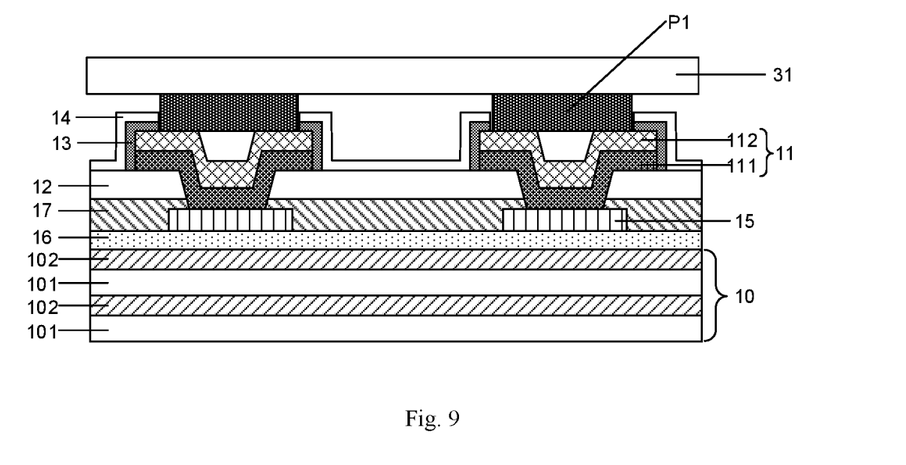
FIG. 9 is a first schematic cross-sectional view of a display device provided by an embodiment of the present disclosure.

In implementations, the above display device provided by the embodiments of the present disclosure, as shown in FIG. 9, may further include: a control chip 31.

The control chip 31 includes: a plurality of contact terminals P1.

The contact terminals P1 are directly bound and connected to contact electrodes 11 in the display panel.

The above control chip 31 is directly bound and connected to the contact electrodes 11 through the contact terminals P1, so the control chip 31 may be coupled with signal wires (such as a gate line) in the display panel through the contact electrodes 11 to control the display panel to display pictures. Moreover, the structure is simple, and the manufacturing cost is low.

Figure 10:
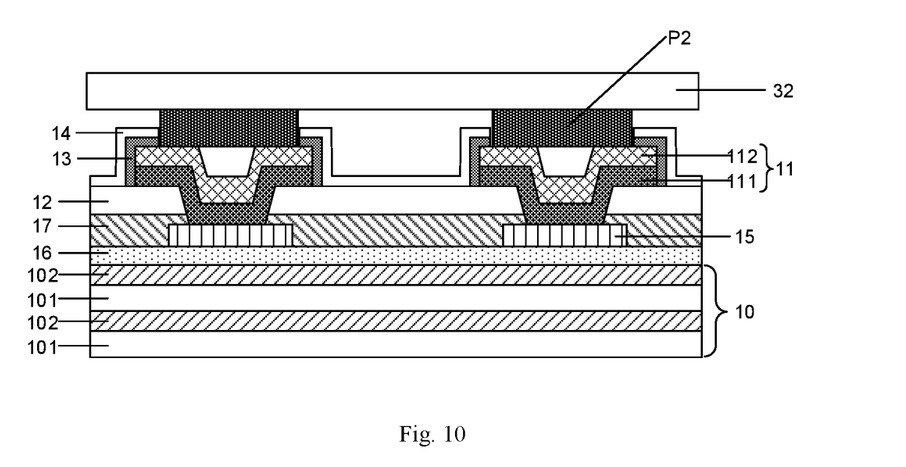
FIG. 10 is a second schematic cross-sectional view of a display device provided by an embodiment of the present disclosure.

In addition, the above display device provided by the embodiments of the present disclosure, as shown in FIG. 10, may further include: a flexible circuit board 32, and the control chip (not shown in the figure).

The control chip is bound and connected to the contact electrodes 11 through the flexible circuit board 32.

In practical application, the flexible circuit board 32 may include contact pins P2, and the flexible circuit board 32 may be bound and connected to the contact electrodes 11 through the contact pins P2. One end of the flexible circuit board 32 is bound and connected to the contact electrodes 11, the other end of the flexible circuit board 32 is bent to a side, facing away from a display surface, of the display panel, and is coupled with the control chip, so that a bezel on the display surface side of the display panel may be reduced, and a narrow bezel of the display device may be realized.

In the display panel and the display device provided by the embodiments of the present disclosure, the barrier layer is in contact with the inorganic film layer by removing at least part of the organic film layer in the gaps between the adjacent contact electrodes. Both the barrier layer and the inorganic film layer include the inorganic material, so the adhesion between the barrier layer and the inorganic film layer is good, thereby increasing the adhesion of the barrier layer. In addition, by removing part of the organic film layer, the water absorption of the organic film layer is reduced, the barrier layer is prevented from falling off, and the risk that the control chip falls off is reduced.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims and their equivalents.

What is claimed is:

1. A display panel, comprising:
    a base substrate;
    a plurality of contact electrodes, on the base substrate in a non-display region of the display panel;
    an inorganic film layer, on sides, close to the base substrate, of the contact electrodes; the inorganic film layer comprising an inorganic material;
    an organic film layer, on sides, facing away from the base substrate, of the contact electrodes; and
    a barrier layer, on a side, facing away from the base substrate, of the organic film layer;
    the barrier layer comprising an inorganic material;
    wherein the organic film layer is provided with openings in at least part of gaps between adjacent contact electrodes among the plurality of contact electrodes; and
    in the at least part of the gaps between the adjacent contact electrodes, the barrier layer is in contact with the inorganic film layer through the openings.

2. The display panel according to claim 1, wherein the organic film layer is provided with openings in all gaps between the adjacent contact electrodes; and in the all gaps, the barrier layer is in contact with the inorganic film layer through the openings.

3. The display panel according to claim 1, wherein:
    the organic film layer comprises:
        a plurality of first through holes each corresponding to a respective one of the plurality of contact electrodes;
    the barrier layer comprises:
        a plurality of second through holes each corresponding to a respective one of the plurality of first through holes; and
    wherein the plurality of contact electrodes are exposed through the plurality of first through holes and the plurality of second through holes.

4. The display panel according to claim 1, wherein the organic film layer is attached to side edges of the contact electrodes to protect the contact electrodes.

5. The display panel according to claim 4, wherein the organic film layer covers edges of surfaces of the sides, facing away from the base substrate, of the contact electrodes.

6. The display panel according to claim 5, wherein in the non-display region, an orthographic projection of the organic film layer on the base substrate is within an orthographic projection of the barrier layer on the base substrate.

7. The display panel according to claim 1, wherein at least one contact electrode of the plurality of contact electrodes comprises at least:
    a first sub-electrode; and
    a second sub-electrode; and
    wherein the first sub-electrode and the second sub-electrode are stacked; and
    the second sub-electrode is on a side, facing away from the base substrate, of the first sub-electrode.

8. The display panel according to claim 7, further comprising:
    a thin film transistor in a display region;
    wherein the first sub-electrode and a source of the thin film transistor are located in a same film layer.

9. The display panel according to claim 8, further comprising:
    a gate line coupled with a gate of the thin film transistor;
    wherein the contact electrodes are coupled with the gate line.

10. The display panel according to claim 1, further comprising:
a plurality of light-emitting devices, an encapsulation layer, and a touch electrode layer in a display region of the display panel;
wherein the plurality of light-emitting devices are on the base substrate, the encapsulation layer covers the plurality of light-emitting devices, the barrier layer extends into the display region, the barrier layer is on a side, facing away from the base substrate, of the encapsulation layer, and the touch electrode layer is on a side, facing away from the base substrate, of the barrier layer.

11. The display panel according to claim 1, wherein the inorganic material comprised by the barrier layer is same as the inorganic material comprised by the inorganic film layer.

12. The display panel according to claim 1, wherein the base substrate comprises:
at least one layer of flexible substrate.

13. A display device, comprising: the display panel according to claim 1.

14. The display device according to claim 13, further comprising:
a control chip;
wherein the control chip comprises:
a plurality of contact terminals;
wherein the plurality of contact terminals are directly bound and connected to the plurality of contact electrodes in the display panel.

15. The display device according to claim 13, further comprising:
a flexible circuit board; and
a control chip;
wherein the control chip is bound and connected to the plurality of contact electrodes through the flexible circuit board.

16. The display panel according to claim 1, wherein the barrier layer is not in direct contact with the plurality of contact electrodes.

17. A display panel, comprising:
a base substrate;
a plurality of contact electrodes, on the base substrate in a non-display region of the display panel;
an inorganic film layer, on sides, close to the base substrate, of the contact electrodes; the inorganic film layer comprising an inorganic material;
an organic film layer, on sides, facing away from the base substrate, of the contact electrodes;
a barrier layer, on a side, facing away from the base substrate, of the organic film layer;
the barrier layer comprising an inorganic material; and
a plurality of light-emitting devices, an encapsulation layer, and a touch electrode layer in a display region of the display panel;
wherein the organic film layer is provided with openings in at least part of gaps between adjacent contact electrodes among the plurality of contact electrodes;
the plurality of light-emitting devices are on the base substrate, the encapsulation layer covers the plurality of light-emitting devices, the barrier layer extends into the display region, the barrier layer is on a side, facing away from the base substrate, of the encapsulation layer, and the touch electrode layer is on a side, facing away from the base substrate, of the barrier layer.

18. The display panel according to claim 17, wherein:
the organic film layer comprises:
a plurality of first through holes each corresponding to a respective one of the plurality of contact electrodes;
the barrier layer comprises:
a plurality of second through holes each corresponding to a respective one of the plurality of first through holes; and
wherein the plurality of contact electrodes are exposed through the plurality of first through holes and the plurality of second through holes.

19. The display panel according to claim 17, wherein the organic film layer is attached to side edges of the contact electrodes to protect the contact electrodes.

20. The display panel according to claim 17, wherein at least one contact electrode of the plurality of contact electrodes comprises at least:
a first sub-electrode; and
a second sub-electrode; and
wherein the first sub-electrode and the second sub-electrode are stacked; and
the second sub-electrode is on a side, facing away from the base substrate, of the first sub-electrode.

* * * * *